(12) United States Patent (10) Patent No.: US 10,847,237 B2
Xiang et al. (45) Date of Patent: Nov. 24, 2020

(54) DRIVING CIRCUIT, DISPLAY DEVICE AND DRIVING METHOD

(71) Applicant: Shanghai Tianma AM-OLED Co., Ltd., Shanghai (CN)

(72) Inventors: Dongxu Xiang, Shanghai (CN); Yue Li, Shanghai (CN); Renyuan Zhu, Shanghai (CN); Yana Gao, Shanghai (CN); Xingyao Zhou, Shanghai (CN); Zhonglan Cai, Shanghai (CN); Juan Zhu, Shanghai (CN); Yilin Xu, Shanghai (CN); Gaojun Huang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 104 days.

(21) Appl. No.: 16/244,301

(22) Filed: Jan. 10, 2019

(65) Prior Publication Data

US 2019/0304560 A1 Oct. 3, 2019

(30) Foreign Application Priority Data

Mar. 28, 2018 (CN) .......................... 2018 1 0262621

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01);
(Continued)

(58) Field of Classification Search
None
See application file for complete search history.

(56) References Cited

U.S. PATENT DOCUMENTS 9,318,055 B2   4/2016  Kim et al.
10,467,938 B1* 11/2019  Xiang .................... G11C 19/28
(Continued)

FOREIGN PATENT DOCUMENTS

CN    104795106 A    7/2015
CN    105280135 A    1/2016
(Continued)

OTHER PUBLICATIONS

Chinese Office Action dated Aug. 20, 2020 for corresponding Chinese Application No. 201810262621.5.
(Continued)

*Primary Examiner* — Tuan T Lam
(74) *Attorney, Agent, or Firm* — Tarolli, Sundheim, Covell & Tummino LLP

(57) ABSTRACT

The present disclosure provides a shift register, a driving circuit, a display device and a driving method for improving the accuracy of an output signal. The first input unit of the shift register is configured to provide a signal at a first fixed potential terminal to a first node, a signal at the input signal terminal to the first node and the signal at the input signal terminal to the first node. A second input unit of the shift register is configured to provide the signal at the input signal terminal to the second node and a signal at the first fixed potential terminal to the second node. An output unit of the shift register is configured to provide a signal at the first clock signal terminal to an output signal terminal of the shift register and a signal at a second fixed potential terminal to the output signal terminal.

17 Claims, 7 Drawing Sheets

(51) Int. Cl.
*G09G 3/20* (2006.01)
*G09G 3/36* (2006.01)

(52) U.S. Cl.
CPC ............... *G09G 2300/0426* (2013.01); *G09G 2310/0286* (2013.01); *G09G 2310/08* (2013.01); *G11C 19/28* (2013.01)

(56) References Cited

U.S. PATENT DOCUMENTS

| | | | | |
|---|---|---|---|---|
| 2016/0189796 | A1* | 6/2016 | Wu | G11C 19/28 345/211 |
| 2016/0217870 | A1* | 7/2016 | Tseng | G11C 19/28 |
| 2017/0004801 | A1* | 1/2017 | Li | G11C 19/28 |
| 2017/0124936 | A1* | 5/2017 | Tseng | G09G 3/2092 |
| 2017/0256204 | A1* | 9/2017 | Xiang | G09G 3/3266 |
| 2017/0287413 | A1* | 10/2017 | Li | G09G 3/3426 |
| 2017/0294166 | A1* | 10/2017 | Kim | G11C 19/28 |
| 2019/0295453 | A1* | 9/2019 | Li | G06F 1/04 |
| 2019/0311669 | A1* | 10/2019 | Zhu | G09G 3/2092 |
| 2019/0325845 | A1* | 10/2019 | Zhu | G09G 3/3266 |
| 2019/0347996 | A1* | 11/2019 | Zhu | G11C 19/28 |
| 2019/0355317 | A1* | 11/2019 | Wang | G09G 3/3677 |

FOREIGN PATENT DOCUMENTS

| | | |
|---|---|---|
| CN | 105304021 A | 2/2016 |
| CN | 106887204 A | 6/2017 |

OTHER PUBLICATIONS

Chinese OA dated Mar. 4, 2020 for corresponding CN Application No. 201810262621.5.

* cited by examiner

DRIVING CIRCUIT, DISPLAY DEVICE AND DRIVING METHOD

CROSS-REFERENCE TO RELATED APPLICATIONS

The present application claims priority to Chinese Patent Application No. 201810262621.5, filed on Mar. 28, 2018, the content of which is incorporated herein by reference in its entirety.

TECHNICAL FIELD

The present disclosure relates to display technology, and more particularly, to a driving circuit, a driving method and a display device.

BACKGROUND

In general, a display device includes a plurality of sub-pixels and a driving circuit for driving the sub-pixels to emit light within the display panel, and the driving circuit usually consists of a plurality of cascaded shift registers. However, in the related art, a potential at a control node inside a shift register circuit can be affected by an output signal. In this way, if the output signal of the shift register fails to switch between a high level and a low level timely, the potential at the control node within the shift register will be affected accordingly, which further causes an error of the output signal of the shift register, thereby negatively affecting a normal display of the display device.

SUMMARY

The present disclosure provides a driving circuit, a driving method and a display device.

In a first aspect of the present disclosure, a driving circuit is provided. The driving circuit includes at least one shift register, and each of the shift register includes: a first input unit configured to provide a signal at a first fixed potential terminal to a first node under control of an input signal terminal, provide a signal at the input signal terminal to the first node under control of a second node and a first clock signal terminal, and provide the signal at the input signal terminal to the first node under control of the second node and a second clock signal terminal; a second input unit configured to provide the signal at the input signal terminal to the second node under control of the first node, and provide a signal at the first fixed potential terminal to the second node under control of the second clock signal terminal; and an output unit configured to provide a signal at the first clock signal terminal to an output signal terminal of the shift register under control of a signal at the first node, and provide a signal at a second fixed potential terminal to the output signal terminal under control of a signal at the second node.

In a second aspect of the present disclosure, a display device is provided. The display device includes the driving circuit according to the second aspect.

In a third aspect of the present disclosure, a driving method is provided. The driving method is applied in the shift register according to the first aspect. The driving method includes: in a first phase, providing a first level signal to the input signal terminal, a second level signal to the first clock signal terminal and the first level signal to the second clock signal terminal, such that the first level signal is outputted at the output signal terminal; in a second phase, providing the second level signal to the input signal terminal, the first level signal to the first clock signal terminal and the second level signal to the second clock signal terminal, such that the first level signal is outputted at the output signal terminal; in a third phase, providing the first level signal to the input signal terminal, the second level signal to the first clock signal terminal and the first level signal to the second clock signal terminal, such that the second level signal is outputted at the output signal terminal; and in a fourth phase, providing the first level signal to the input signal terminal, the first level signal to the first clock signal terminal and the second level signal to the second clock signal terminal, such that the first level signal is outputted at the output signal terminal.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that the terms "first" and "second" used to describe the input units in the embodiments of the present disclosure are not intended to limit these input units. These terms are merely used to distinguish input units from each other. For example, without departing from the scope of the embodiments of the present disclosure, a first input unit may also be referred to as a second input unit. Similarly, a second input unit may also be referred to as a first input unit.

Figure 1:
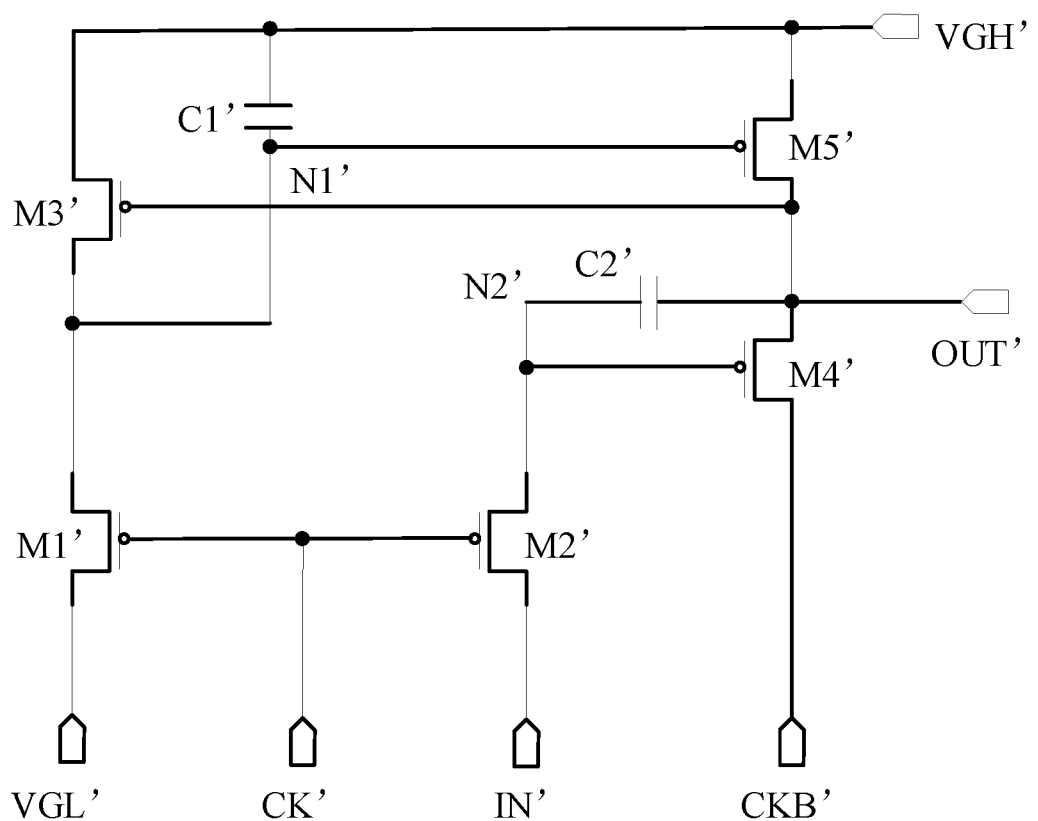
FIG. 1 is a schematic diagram of a circuit structure of a shift register provided in the related art.
Figure 2:
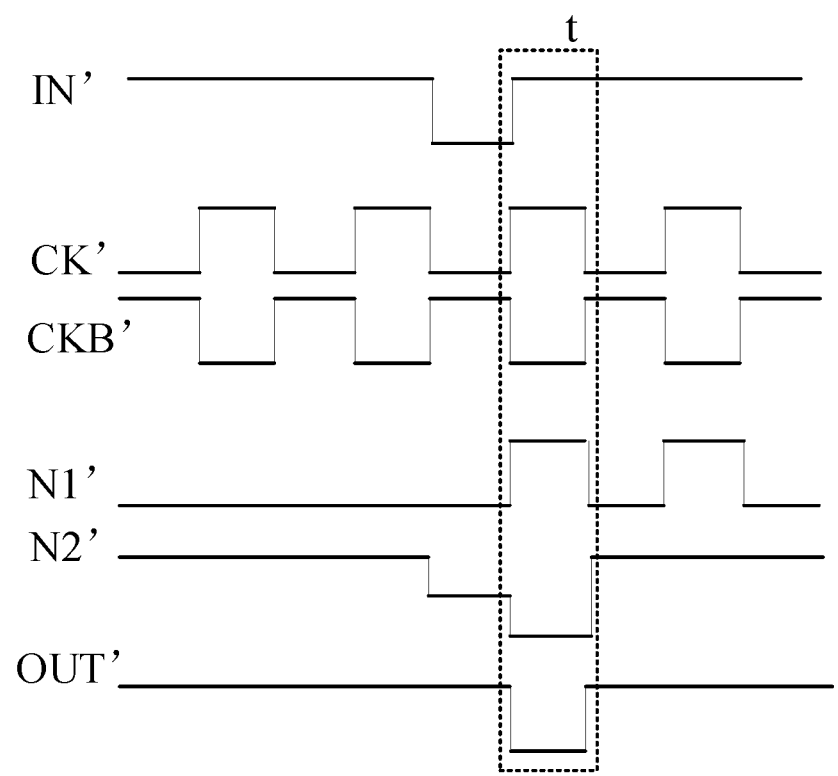
FIG. 2 is an operating sequence diagram of the shift register provided in the related art.

FIG. 1 is a schematic diagram of an internal structure of a shift register provided in the prior art, and FIG. 2 is a driving sequence diagram of the shift register shown in FIG. 1. The shift register has an output terminal OUT' connected to a thin film transistor M3'. In this way, in the case that the shift register operates normally, taking a phase t as an example, in which the output terminal OUT' outputs a low level, a feedback of the output terminal OUT' will cause the thin film transistor M3' to be switched on under control of the low level, a high level signal VGH' writes a potential at a first node N1' to high through the thin film transistor M3', and further a thin film transistor M5' is switched off under control of the high level. At this moment, a second node N2' is at a low level, which controls a thin film transistor M4' to be switched on, and a low level signal at a clock signal terminal CKB' is written into the output terminal OUT', so that the output terminal OUT' outputs a low level.

However, based on the internal circuit structure of the shift register in which the output terminal OUT' is connected to a control terminal of the thin film transistor M3', if the output signal at the output terminal OUT' fails to be written to a low level timely, the thin film transistor M3' cannot be switched on timely. In this way, the potential at the first node N1' cannot be written to a high level in time, which results in that the thin film transistor M5' and the thin film transistor M4' may be simultaneously switched on, thereby resulting in a contention risk for the output from the output terminal OUT' which may lead to an output error.

Figure 3:
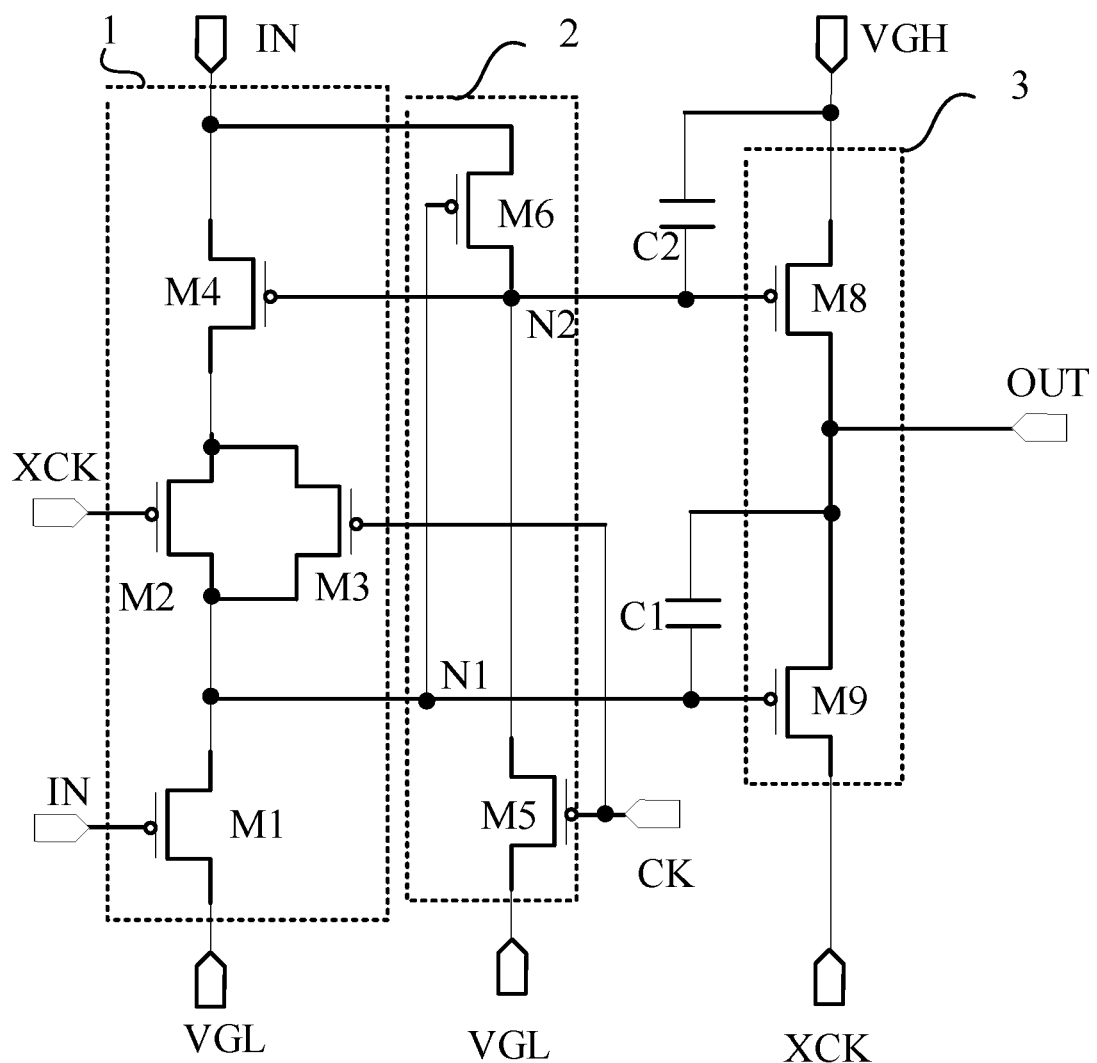
FIG. 3 is a schematic diagram of a circuit structure of a shift register according to an embodiment of the present disclosure.

In view of the above, a shift register is provided according to an embodiment of the present disclosure. FIG. 3 is a schematic diagram of an internal structure of a shift register according to an embodiment of the present disclosure. As shown in FIG. 3, the shift register includes a first input unit 1, a second input unit 2 and an output unit 3.

The first input unit 1 is configured to: provide a signal at a first fixed potential terminal VGL to a first node N1 under control of an input signal terminal IN; provide a signal at the input signal terminal IN to the first node N1 under control of a second node N2 and a first clock signal terminal XCK; and provide the signal at the input signal terminal IN to the first node N1 under control of the second node N2 and a second clock signal terminal CK.

The second input unit 2 is configured to: provide the signal at the input signal terminal IN to the second node N2 under control of the first node N1; and provide the signal at the first fixed potential terminal VGL to the second node N2 under control of the second clock signal terminal CK.

The output unit 3 is configured to: provide a signal at the first clock signal terminal XCK to an output signal terminal OUT of the shift register under control of a signal at the first node N1; and provide a signal at a second fixed potential terminal VGH to the output signal terminal OUT under control of a signal at the second node N2.

Figure 4:
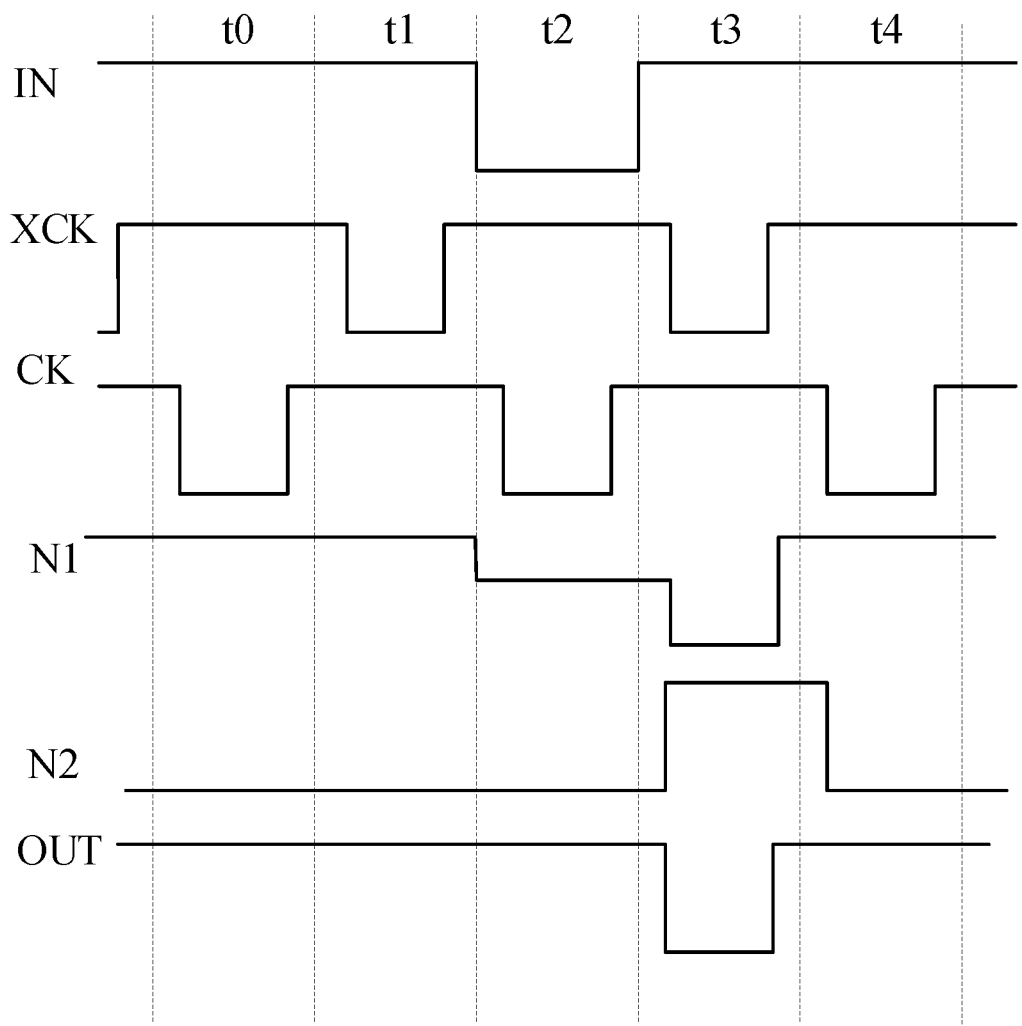
FIG. 4 an operating sequence diagram of the shift register according to the embodiment of the present disclosure.

FIG. 4 is an operating sequence corresponding to FIG. 3 for illustrating an operating process of the shift register described above, where the operating process of the shift register includes an initial phase t0, a first phase t1, a second phase t2, a third phase t3 and a fourth phase t4.

In the initial phase t0, the input signal terminal IN provides a high level, the first clock signal terminal XCK provides a high level, the second clock signal terminal CK provides a low level. In response to the low level at the second clock signal terminal CK, the second input unit 2 writes a potential at the second node N2 to a low level according to a signal at the first fixed potential terminal VGL; in response to the low level at the second node N2 and the second clock signal terminal CK, the first input unit 1 writes a potential at the first node N1 to a high level according to the high level provided by the input signal terminal IN; and in response to the low level at the second node N2, the output unit 3 controls the output terminal OUT to output a high level according to a signal at the second fixed potential terminal VGH.

In the first phase t1, the input signal terminal IN provides a high level, the first clock signal terminal XCK provides a low level, and the second clock signal terminal CK provides a high level. The first node N1 is remained at the high level; the second node N2 is remained at the low level; and in response to the low level at the second node N2, the output unit 3 controls the output terminal OUT to maintain at the high level according to the signal at the second fixed potential terminal VGH.

In the second phase t2, the input signal terminal IN provides a low level, the first clock signal terminal XCK provides a high level, and the second clock signal terminal CK provides a low level. In response to the low level at the second clock signal terminal CK, the second input unit 2 writes the potential at the second node N2 to a low level according to the signal at the first fixed potential terminal VGL; in response to the low level at the second node N2 and the second clock signal terminal CK, the first input unit 1 writes the potential at the first node N1 to a low level according to the low level provided by the input signal terminal IN; in response to the low level at the first node N1, the output unit 3 maintains the output terminal OUT at the high level according to the high level provided by the first clock signal terminal XCK; and in the meantime, in response to the low level at the second node N2, the output unit 3 maintains the output terminal OUT stably at the high level according to the signal at the second fixed potential terminal VGH.

In the third phase t3, the input signal terminal IN provides a high level, the first clock signal terminal XCK provides a low level, and the second clock signal terminal CK provides a high level. The first node N1 is maintained at the low level; in response to the low level at the first node N1, the second input unit 2 writes the potential at the second node N2 to a high level according to the high level provided by the input terminal IN; and in response to the low level at the first node N1, the output unit 3 controls the output terminal OUT to output a low level and pulls the potential at the first node N1 down to a lower level according to the low level provided by the first clock signal terminal XCK.

In the fourth phase t4, the input signal terminal IN provides a high level, the first clock signal terminal XCK provides a high level, and the second clock signal terminal CK provides a low level. In response to the low level at the second clock signal terminal CK, the second input unit 2 writes the potential at the second node N2 to a low level according to the signal at the first fixed potential terminal VGL; in response to the low level at the second node N2 and the second clock signal terminal CK, the first input unit 1 writes the potential at the first node N1 to a high level according to the high level provided by the input signal terminal IN; and in response to the low level at the second node N2, the output unit 3 controls the output terminal OUT to output a high level according to the high level provided by the second fixed potential terminal VGH.

Through the above description of the operating process of the shift register, it can be seen that the potentials at the first node N1 and the second node N2 of the shift register according to the present embodiment are not under control of an output signal at the output signal terminal OUT. When the output signal at the output signal terminal OUT fails to switch between high and low levels timely, the potentials at the first node N1 and the second node N2 will not be affected, so that the output signal at the output signal terminal OUT will not further deviate, thereby improving the accuracy of the output signal at the output signal terminal OUT.

Illustratively, the input signal terminal IN is used to receive an input signal, the first fixed potential terminal VGL is used to receive a first fixed potential signal, and the second fixed potential terminal VGH is used to receive a second fixed potential signal. The first fixed potential signal is different from the second fixed potential signal. In this embodiment, a potential at the first fixed potential signal is lower than a potential at the second fixed potential signal.

As shown in FIG. 4, the signal at the first clock signal terminal XCK and the signal at the second clock signal terminal CK are both pulse signals. When the signal at the first clock signal terminal XCK is at a low level, the signal at the second clock signal terminal CK is at a high level, and when the signal at the second clock signal terminal CK is at a low level, the signal at the first clock signal terminal XCK is at a high level.

As shown in FIG. 3, the first input unit 1, for example, includes a first transistor M1, a second transistor M2, a third transistor M3, and a fourth transistor M4.

The first transistor M1 has a control terminal connected to the input signal terminal IN, a first terminal connected to the first fixed potential terminal VGL, and a second terminal connected to the first node N1. Under control of the signal provided by the input signal terminal IN, the first transistor M1 controls an electrical connection between the first node N1 and the first fixed potential terminal VGL, so as to adjust the potential at the first node N1.

The second transistor M2 has a control terminal connected to the first clock signal terminal XCK, a first terminal connected to the first node N1 and a second terminal connected to a first terminal of a fourth transistor M4. The third transistor M3 has a control terminal connected to the second clock signal terminal CK, a first terminal connected to the first node N1 and a second terminal connected to the first terminal of the fourth transistor M4. The fourth transistor M4 has a control terminal connected to the second node N2, the first terminal connected to the second terminals of the second transistor M2 and the third transistor M3, and a second terminal connected to the input signal terminal IN. Under control of the signal provided by the second node N2 and the first clock signal terminal XCK, the fourth transistor M4 and the second transistor M2 control an electrical connection between the input signal terminal IN and the first node N1, so as to adjust the potential at the first node N1. Under control of the signal provided by the second node N2 and the second clock signal terminal CK, the fourth transistor M4 and the third transistor M3 control the electrical connection between the input signal terminal IN and the first node N1, so as to adjust the potential at the first node N1.

In the present embodiment, the control terminals of the second transistor M2 and the third transistor M3 are connected to the first clock signal terminal XCK and the second clock signal terminal CK, respectively. When the signal at the clock signal terminal XCK is at a low level, the signal at the second clock signal terminal CK is at a high level, and when the signal at the second clock signal terminal CK is at a low level, the signal at the first clock signal terminal XCK is at a high level. That is, the second transistor M2 and the third transistor M3 are switched on in a time division manner. In this way, comparing with the case of the second terminal of the fourth transistor M4 being directly connected to the first node N1, the present embodiment, where the second transistor M2 or the third transistor M3 is connected to the fourth transistor M4, can raise a potential at the second terminal of the fourth transistor M4 when the first node N1 is at the low level, so as to avoid a situation that the fourth transistor M4 is broken down due to an excessive voltage drop between the control terminal and the first terminal of the fourth transistor M4 when the first node N1 is at the low level.

In the present embodiment, the first transistor M1, the second transistor M2, the third transistor M3, and the fourth transistor M4 are all PMOS transistors, each of which is switched on when its control terminal is at a low level and off when its control terminal is at a high level. Unless otherwise stated, the transistors mentioned hereafter in this embodiment are all PMOS transistors. In a specific implementation, a gate of each transistor mentioned is used as the control terminal thereof. In addition, according to the signal at the gate of each transistor and its type, the first terminal can be used as a drain and the second terminal can be used as a drain, and vice versa, which is not specifically limited herein.

In the embodiment shown in FIG. 3, the second input unit 2 includes a fifth transistor M5 and a sixth transistor M6. The fifth transistor M5 has a control terminal connected to the second clock signal terminal CK, a first terminal connected to the first fixed potential terminal VGL, and a second terminal connected to the second node N2. Under control of the signal provided by the second clock signal terminal CK, the fifth transistor M5 controls an electrical connection between the first fixed potential terminal VGL and the second node N2, so as to adjust the potential at the second node N2.

The sixth transistor M6 has a control terminal connected to the first node N1, a first terminal connected to the input signal terminal IN, and a second terminal connected to the second node N2. Under control of the signal provided by the first node N1, the sixth transistor M6 controls an electrical connection between the input signal terminal IN and the second node N2, so as to adjust the potential at the second node N2.

Figure 5:
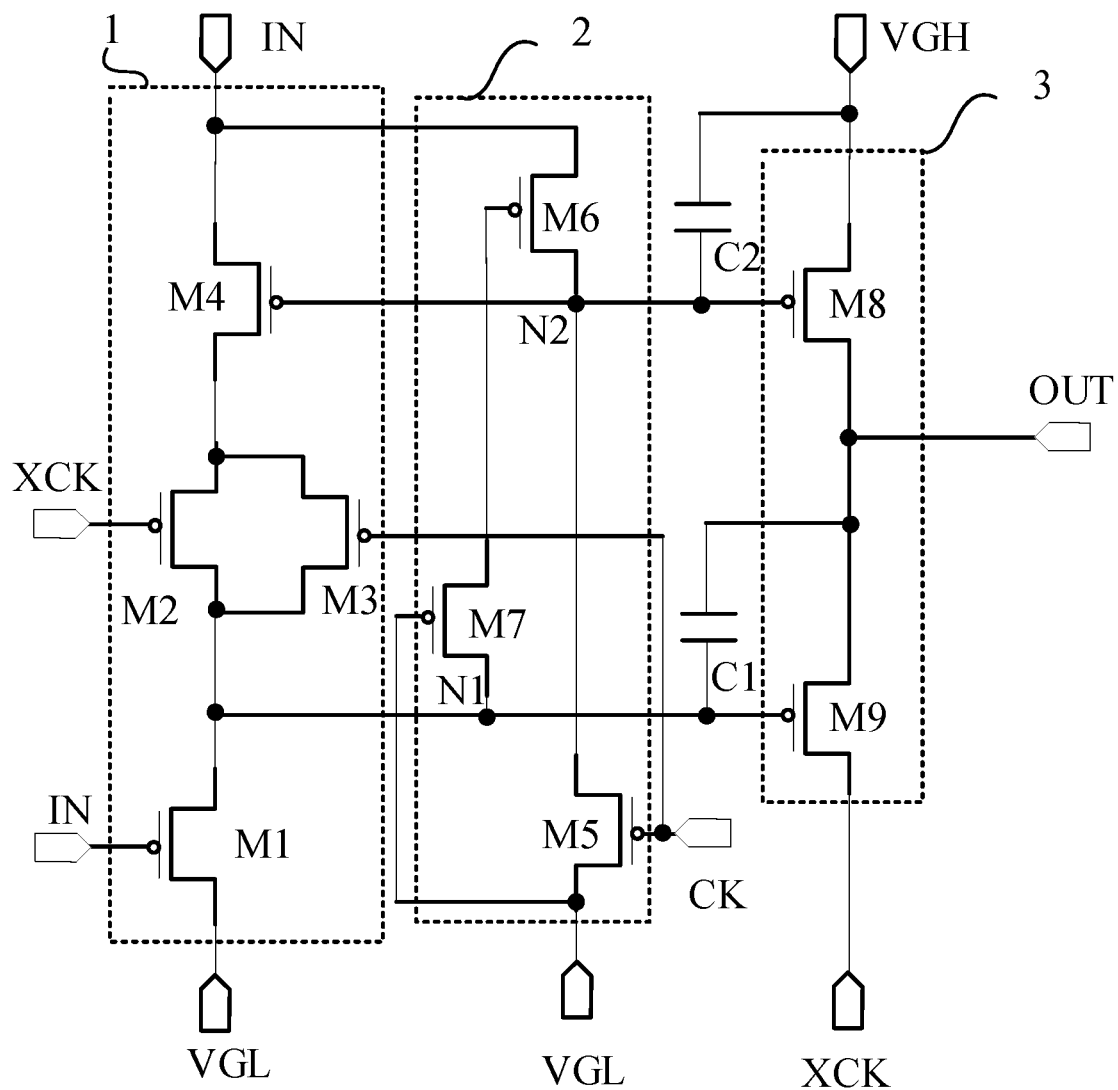
FIG. 5 is a schematic diagram of a circuit structure of another shift register according to another embodiment of the present disclosure.

FIG. 5 is a schematic diagram of an internal structure of another shift register according to another embodiment of the present disclosure. In this embodiment, the second input unit 2 further includes a seventh transistor M7. The seventh transistor M7 has a control terminal connected to the first fixed potential terminal VGL, a first terminal connected to the first node N1, and a second terminal connected to the control terminal of the sixth transistor M6. Under control of the signal provided by the first fixed potential terminal VGL, the seventh transistor M7 controls an electrical connection between the first node N1 and the control terminal of the sixth transistor M6, so as to control the switch-on or switch-off of the sixth transistor M6. In addition, in the present embodiment, comparing with a case of the control terminal of the sixth transistor M6 being directly connected to the first node N1, the present embodiment, where the seventh transistor M7 is connected to the sixth transistor M6, can raise a potential at the control terminal of the sixth transistor M6 when the first node N1 is at the low level, so as to avoid a situation that the sixth transistor M6 is broken down due to an excessive voltage drop between the control terminal and the first or second terminals of the sixth transistor M6 when the first node N1 is at the low level.

As shown in FIG. 3 and FIG. 5, the output unit 3 includes an eighth transistor M8 and a ninth transistor M9. The eighth transistor M8 has a control terminal connected to the second node N2, a first terminal connected to the second fixed potential terminal VGH, and a second terminal connected to the output signal terminal OUT. Under control of the signal provided by the second node N2, the eighth transistor M8 controls an electrical connection between the second fixed potential terminal VGH and the output signal terminal OUT, so as to adjust the output signal at output signal terminal OUT. The ninth transistor M9 has a control terminal connected to the first node N1, a first terminal connected to the first clock signal terminal XCK, and a second terminal connected to the output signal terminal OUT. Under control of the signal provided by the first node N1, the ninth transistor M9 controls an electrical connection between the first clock signal terminal XCK and the output signal terminal OUT, so as to adjust the output signal at the output signal terminal OUT.

The above shift register further includes a first capacitor C1 and a second capacitor C2. The first capacitor C1 has a first terminal connected to the first node N1, and a second terminal connected to the output signal terminal OUT. The second capacitor C2 has a first terminal connected to the second node N2, and a second terminal connected to the second fixed potential terminal VGH. The first capacitor C1 is configured to maintain the potential at the first node N1 by a coupling effect of the first capacitor C1 when the first node N1 is in a floating state. The second capacitor C2 is configured to maintain the potential at the second node N2 by a coupling effect of the second capacitor C2 when the second node N2 is in the floating state.

The operating process of the above shift register will be further described in combination with FIG. 3 and FIG. 4 as follow.

In the initial phase t0, the second clock signal terminal CK provides a low level to switch on the fifth transistor M5 and the third transistor M3, and the fifth transistor M5 writes the potential at the second node N2 to a low level according to the signal at the first fixed potential terminal VGL, so as to switch on the fourth transistor M4 and the eighth transistor M8; the input signal terminal IN provides a high level, and the potential at the first node N1 is written to a high level via the switched-on fourth transistor M4 and third transistor M3, so as to switch off the ninth transistor M9; and the signal at the first fixed potential terminal VGH, via the switched-on eighth transistor M8, controls the output signal terminal OUT to output a high level.

In the first phase t1, the input signal terminal IN provides a high level, so as to switch off the first transistor M1; with the coupling effect of the first capacitor C1, the first node N1 is maintained at a high level, so as to switch off the sixth transistor M6 and the ninth transistor M9; the second clock signal terminal CK provides a high level, so as to switch off the fifth transistor M5 and the third transistor M3; with the coupling effect of the second capacitor C2, the second node N2 is maintained at a low level, so as to switch on the fourth transistor M4 and the eighth transistor M8; the first clock signal terminal XCK provides a low level to switch on the second transistor M2, so that the high level signal provided by the input signal terminal IN, via the switched-on fourth transistor M4 and second transistor M2, writes the potential at the first node N1 to a high level; and the signal at the second fixed potential terminal VGH, via the switched-on eighth transistor M8, controls the output signal terminal OUT to output a high level.

In the second phase t2, the input signal terminal IN provides a low level, so as to switch on the first transistor M1, and the signal at the first fixed potential terminal VGL, via the switched-on first transistor M1, writes the potential at the first node N1 to a low level, so as to switch on the sixth transistor M6 and the ninth transistor M9; the first clock signal terminal XCK provides a high level, and controls the output signal terminal OUT to output a high level through the switched-on ninth transistor M9; the second clock signal terminal CK provides a low level, so as to switch on the fifth transistor M5 and the third transistor M3; the signal at the first fixed potential terminal VGL, via the switched-on fifth transistor M5, writes the potential at the second node N2 to a low level, so as to switch on the fourth transistor M4 and the eighth transistor M8; the low level signal at the input signal terminal IN stably, via the switched-on fourth transistor M4 and third transistor M3, maintains the potential at the first node N1 at a low level; and the signal outputted by the second fixed potential terminal VGH, via the switched-on eighth transistor M8, controls an output signal terminal OUT to stably output a high level.

In the third phase t3, the input signal terminal IN provides a high level, so as to switch off the first transistor M1; the first node N1 is maintained at a low level with the coupling effect of the first capacitor C1, so as to switch on the sixth transistor M6 and the nine-transistor M9; the first clock signal terminal XCK provides a low level, which controls the output signal terminal OUT to output a low level through the switched-on ninth transistor M9, and pulls the potential at the first node N1 down to a lower level with the coupling effect of the first capacitor C1, so that the signal at the first clock signal terminal XCK can be completely outputted via the ninth transistor M9; and the high level signal provided by the input signal terminal IN, via the switched-on sixth transistor M6, writes the potential at the second node N2 to a high level, so as to switch off the fourth transistor M4 and the eighth transistor M8.

In the fourth phase t4, the second clock signal terminal CK provides a low level, so as to switch on the third transistor M3 and the fifth transistor M5; the signal at the first fixed potential terminal VGL, via the switched-on fifth transistor M5, writes the potential at the second node N2 to a low level, so as to switch on the fourth transistor M4 and the eighth transistor M8; and the signal at the second fixed potential terminal VGH, via the switched-on eighth transistor M8, controls the output signal terminal OUT to output a high level; the high level signal provided by the input signal terminal IN, via the switched-on fourth transistor M4 and third transistor M3, writes the potential at the first node N1 to a high level, so as to switch off the sixth transistor M6 and the ninth transistor M9.

In the embodiment shown in FIG. 5, the control terminal of the seventh transistor M7 is connected to the first fixed potential terminal VGL, so that the seventh transistor M7 is always switched-on in any phase. Therefore, the processing process of the embodiment shown in FIG. 5 is the same as that of the embodiment shown in FIG. 3, which is not repeated herein.

The embodiments of the present disclosure also provide a driving method applied in the above shift register. Referring to FIG. 4, the operating process of the shift register includes a first phase t1, a second phase t2, a third phase t3, and a fourth phase t4.

In the first phase t1, a first level signal is provided to the input signal terminal IN, a second level signal is provided to the first clock signal terminal XCK, the first level signal is provided to the second clock signal terminal CK, and the output signal terminal OUT outputs the first level signal;

In the second phase t2, the second level signal is provided to the input signal terminal IN, the first level signal is provided to the first clock signal terminal XCK, the second level signal is provided to the second clock signal terminal CK, and the output signal terminal OUT outputs the first level signal;

In the third phase t3, the first level signal is provided to the input signal terminal IN, the second level signal is provided to the first clock signal terminal XCK, the first level signal is provided to the second clock signal terminal CK, and the output signal terminal OUT outputs the second level signal; and In the fourth phase t4, the first level signal is provided to the input signal terminal IN, the first level signal is provided to the first clock signal terminal XCK, the second level signal is provided to the second clock signal terminal CK, and the output signal terminal OUT outputs the first level signal.

The specific operating process of the shift register has been described in detail in above embodiment, which is not repeated herein.

By adopting the driving method according to the embodiments of the present disclosure, the potentials a the first node N1 and the second node N2 of the shift register are not controlled by the output signal at the output signal terminal OUT, so that they will not be affected even if the output signal at the output terminal of the shift register fails to switch between high and low levels timely. In this way, the signal output from the output signal terminal OUT will not further deviate, and the accuracy of the output signal at the output signal terminal OUT can be improved.

Figure 6:
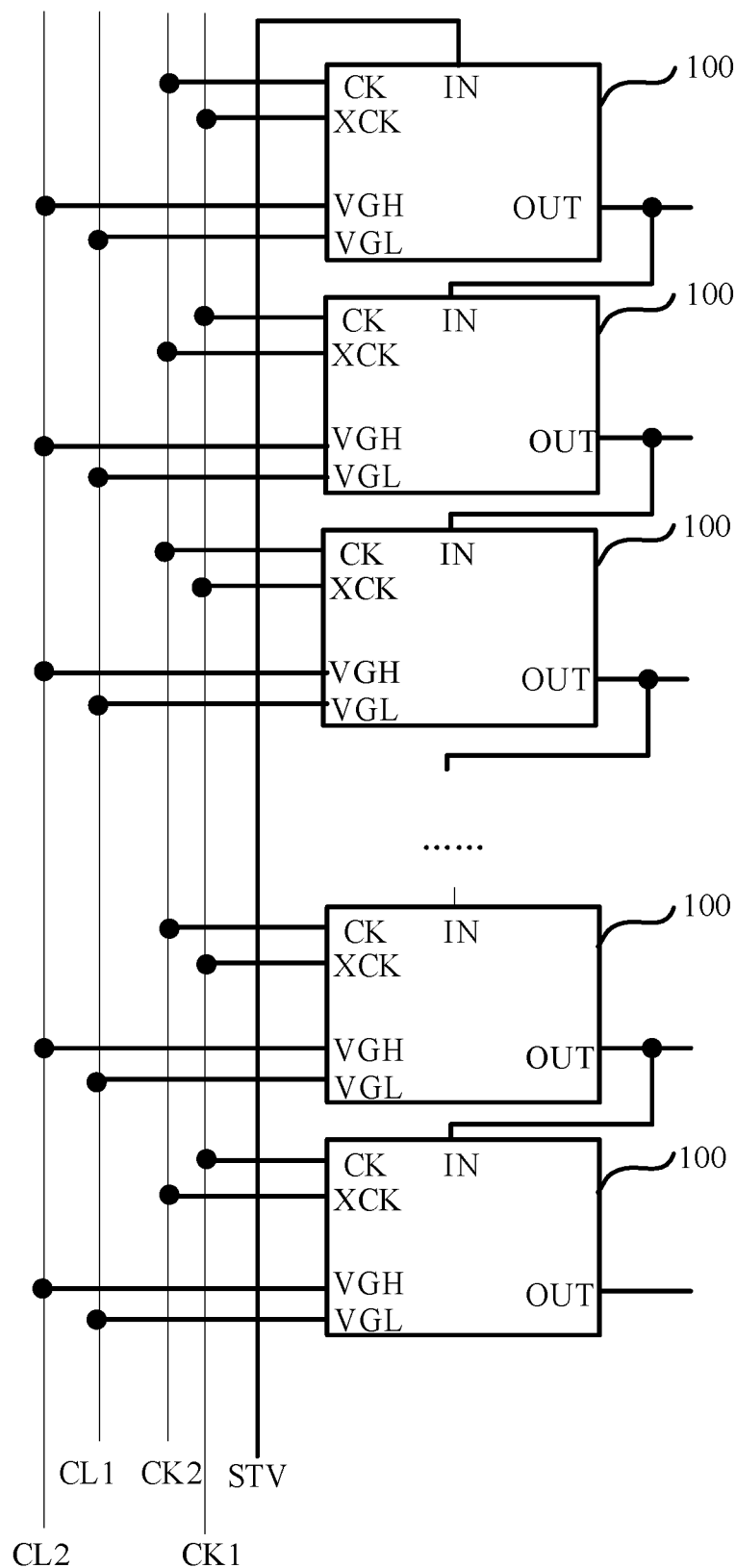
FIG. 6 is a schematic diagram of a driving circuit according to an embodiment of the present disclosure.

FIG. 6 is a schematic diagram of a driving circuit according to an embodiment of the present invention. The driving circuit according to the embodiment of the present disclosure includes a plurality of cascaded shift registers 100 mentioned above. The input signal terminal IN of the shift register at a 1$^{st}$ stage of the plurality of cascaded shift registers 100 is connected to a start signal terminal STV. The input signal terminal IN of the shift register 100 at each stage other than the first stage of the plurality of cascaded shift registers 100 is connected to the output signal terminal OUT of the shift register 100 at its previous stage. The first clock signal terminal XCK of the shift register 100 at each odd numbered stage of the plurality of cascaded shift registers is configured to receive the first clock signal CK1 and the second clock signal terminal CK of the shift register 100 at each odd numbered stage of the plurality of cascaded shift registers is configured to receive the second clock signal CK2. The first clock signal terminal XCK of the shift register 100 at each even numbered stage of the plurality of cascaded shift registers is configured to receive the second clock signal CK2 and the second clock signal terminal CK of the shift register 100 at each even numbered stage of the plurality of cascaded shift registers is configured to receive the first clock signal CK1. The first clock signal CK1 and the second clock signal CK2 are both pulse signals. Further, when the first clock signal CK1 is at a low level, the second clock signal CK2 is at a high level, and when the second clock signal CK2 is at a low level, the first clock signal CK1 is at a high level.

In addition, in the driving circuit as shown in FIG. 6, each stage of shift register 100 has a first fixed potential terminal VGL connected to a driving chip (not shown) through a first voltage signal line CL1, and a second fixed potential terminal VGH connected to the driving chip through a second voltage signal line CL2.

Since the driving circuit according to this embodiment includes the plurality of cascaded shift registers, by adopting such driving circuit, the potentials at the first node N1 and the second node N2 of the shift register are not controlled by the output signal at the output signal terminal OUT, and thus will not be affected even if the output signal at the output terminal of the shift register fails to switch between high and low levels timely. In this way, the signal output from the output signal terminal OUT will not further deviate, and the accuracy of the output signal at the output signal terminal OUT can be improved.

Figure 7:
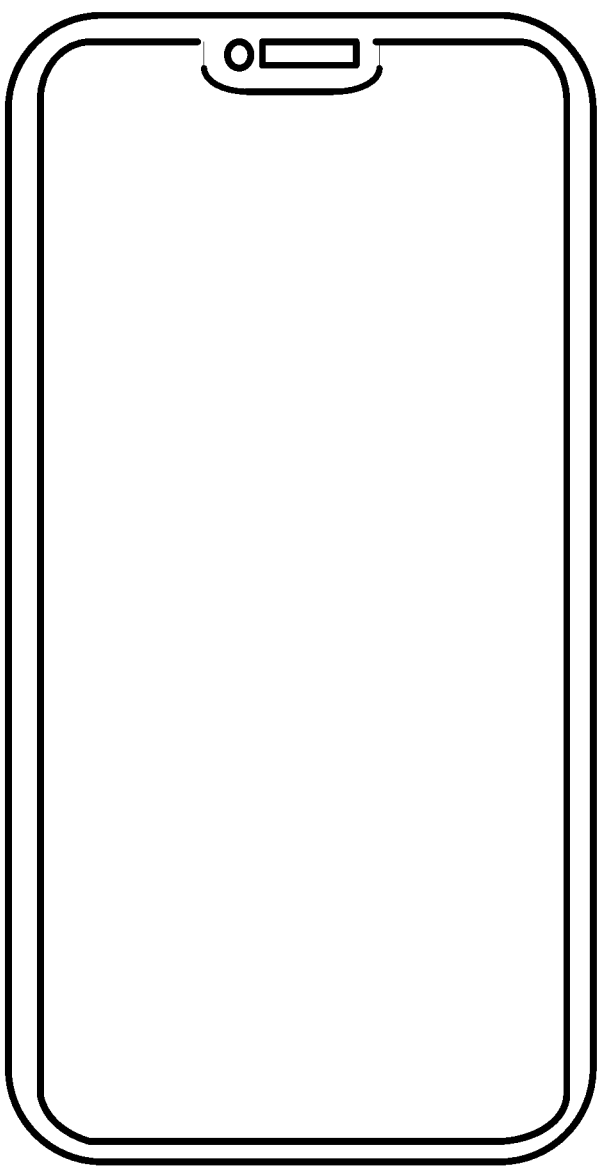
FIG. 7 is a schematic diagram of a display device according to an embodiment of the present disclosure.

FIG. 7 is a structural schematic diagram of a display device according to an embodiment of the present disclosure. The display device includes the driving circuit as mentioned above. The driving circuit is described in detail in the above embodiments, which will not be repeated herein. The display device shown in FIG. 7 is merely illustrative. The display device can be any electronic device having a display function, e.g., a mobile phone, a tablet computer, a notebook computer, an e-paper device or a television.

Since the display device according to the embodiment includes the driving circuit, by adopting such display device, the potentials at the first node N1 and the second node N2 of the shift register are not controlled by the output signal at the output signal terminal OUT, and thus will not be affected even if the output signal at the output terminal of the shift register fails to switch between high and low levels timely. In this way, the signal output from the output signal terminal OUT will not further deviate, and the accuracy of the output signal at the output signal terminal OUT can be improved.

It should be understood that, the above display device provided in the embodiment can be an organic light-emitting device or a liquid crystal display device.

In the organic light-emitting display device, a plurality of organic light-emitting diodes and a pixel compensation circuit connected to each of the plurality of organic light-emitting diodes are generally provided. Generally, a light-emitting control transistor for controlling the light-emitting of the organic light-emitting diode and a scan control transistor for controlling data signal input are provided in the pixel compensation circuit. In a specific implementation, when the display device provided by the embodiment of the present disclosure is an organic light-emitting display device, the organic light-emitting display device may include the above driving circuit provided by the embodiment. The driving circuit can be used as a light-emitting driving circuit to provide a light-emitting control signal to the light-emitting control transistor; or the driving circuit can also serve as a gate driving circuit to provide a scan signal to the gate of the scan control transistor. It is also possible that the organic light-emitting display device includes two driving circuits provided by the present embodiment, one of which is used as the light-emitting driving circuit and the other one is used as the gate driving circuit, which is not limited herein.

In the liquid crystal display device, a plurality of pixel electrodes and a switching transistor connected to each of the plurality of pixel electrodes are generally provided. In a specific implementation, when the display device provided by the embodiment is a liquid crystal display device, the driving circuit provided by the present disclosure can serve as a gate driving circuit to provide a scan signal to a gate of the switching transistor.

The above embodiments are merely preferable embodiments of the present disclosure, which are not intended to limit the present disclosure. Any modification, equivalent replacement and improvement within the spirit and principle of the present disclosure shall fall into the scope of the present disclosure.

What is claimed is:

1. A driving circuit, comprising at least one shift register, and each of the shift register comprising:
    a first input unit configured to provide a signal at a first fixed potential terminal to a first node under control of an input signal terminal, provide a signal at the input signal terminal to the first node under control of a second node and a first clock signal terminal, and provide the signal at the input signal terminal to the first node under control of the second node and a second clock signal terminal;
    a second input unit configured to provide the signal at the input signal terminal to the second node under control of the first node, and provide the signal at the first fixed potential terminal to the second node under control of the second clock signal terminal; and
    an output unit configured to provide a signal at the first clock signal terminal to an output signal terminal under control of a signal at the first node, and provide a signal at a second fixed potential terminal to the output signal terminal under control of a signal at the second node.

2. The driving circuit according to claim 1,
    wherein the signal at the first fixed potential signal is different from the signal at the second fixed potential signal, and
    the signal at the first clock signal terminal and the signal at the second clock signal terminal are both pulse signals, and when the signal at the first clock signal terminal is at a low level, the signal at the second clock signal terminal is at a high level, and when the signal at the second clock signal terminal is at a low level, the signal at the first clock signal terminal is at a high level.

3. The driving circuit according to claim 1, wherein the first input unit comprises a first transistor, a second transistor, a third transistor, and a fourth transistor,
    the first transistor has a control terminal connected to the input signal terminal, a first terminal connected to the first fixed potential terminal, and a second terminal connected to the first node,
    the second transistor has a control terminal connected to the first clock signal terminal, a first terminal connected to the first node and a second terminal connected to a first terminal of the fourth transistor,
    the third transistor has a control terminal connected to the second clock signal terminal, a first terminal connected to the first node and a second terminal connected to the first terminal of the fourth transistor, and
    the fourth transistor has a control terminal connected to the second node, the first terminal connected to the second terminals of the second transistor and the third transistor, and a second terminal connected to the input signal terminal.

4. The driving circuit according to claim 1, wherein the second input unit comprises a fifth transistor and a sixth transistor,
    the fifth transistor has a control terminal connected to the second clock signal terminal, a first terminal connected to the first fixed potential terminal, and a second terminal connected to the second node, and
    the sixth transistor has a control terminal connected to the first node, a first terminal connected to the input signal terminal, and a second terminal connected to the second node.

5. The driving circuit according to claim 4, wherein the second input unit further comprises a seventh transistor, and
    the seventh transistor has a control terminal connected to the first fixed potential terminal, a first terminal connected to the first node, and a second terminal connected to the control terminal of the six transistor.

6. The driving circuit according to claim 1, wherein the output unit comprises an eighth transistor and a ninth transistor,
    the eighth transistor has a control terminal connected to the second node, a first terminal connected to the second fixed potential terminal, and a second terminal connected to the output signal terminal, and
    the ninth transistor has a control terminal connected to the first node, a first terminal connected to the first clock signal terminal, and a second terminal connected to the output signal terminal.

7. The driving circuit according to claim 1, further comprising a first capacitor and a second capacitor,
    the first capacitor has a first terminal connected to the first node, and a second terminal connected to the output signal terminal, and
    the second capacitor has a first terminal connected to the second node, and a second terminal connected to the second fixed potential terminal.

8. The driving circuit according to claim 1, wherein the at least one shift register comprises a plurality of cascaded shift registers,
    wherein the input signal terminal of the shift register at a first stage of the plurality of cascaded shift registers is connected to a start signal terminal,
    the input signal terminal of the shift register at each stage other than the first stage of the plurality of cascaded shift registers is connected to the output signal terminal of the shift register at its previous stage,
    the first clock signal terminal of the shift register at each odd numbered stage of the plurality of cascaded shift registers is configured to receive the first clock signal, and the second clock signal terminal of the shift register at each odd numbered stage of the plurality of cascaded shift registers is configured to receive the second clock signal,
    the first clock signal terminal of the shift register at each even numbered stage of the plurality of cascaded shift registers is configured to receive the second clock signal, and the second clock signal terminal of the shift register at each even numbered stage of the plurality of cascaded shift registers is configured to receive the first clock signal,
    when the first clock signal is at a low level, the second clock signal is at a high level, and
    when the second clock signal is at a low level, the first clock signal is at a high level.

9. A display device, comprising a driving circuit comprising a plurality of cascaded shift registers, wherein each shift register comprises:
    a first input unit configured to provide a signal at a first fixed potential terminal to a first node under control of an input signal terminal, provide a signal at the input signal terminal to the first node under control of a second node and a first clock signal terminal, and provide the signal at the input signal terminal to the first node under control of the second node and a second clock signal terminal;

a second input unit configured to provide the signal at the input signal terminal to the second node under control of the first node, and provide the signal at the first fixed potential terminal to the second node under control of the second clock signal terminal; and an output unit configured to provide a signal at the first clock signal terminal to an output signal terminal of the shift register under control of a signal at the first node, and provide a signal at a second fixed potential terminal to the output signal terminal under control of a signal at the second node, wherein the input signal terminal of the shift register at the first stage of the plurality of cascaded shift registers is connected to a start signal terminal, the input signal terminal of the shift register at each stage other than the first stage of the plurality of cascaded shift registers is connected to the output signal terminal of the shift register at its previous stage, the first clock signal terminal of the shift register at each odd numbered stage of the plurality of cascaded shift registers is configured to receive the first clock signal, and the second clock signal terminal of the shift register at each odd numbered stage of the plurality of cascaded shift registers is configured to receive the second clock signal, the first clock signal terminal of the shift register at each even numbered stage of the plurality of cascaded shift registers is configured to receive the second clock signal, and the second clock signal terminal of the shift register at each even numbered stage of the plurality of cascaded shift registers is configured to receive the first clock signal, when the first clock signal is at a low level, the second clock signal is at a high level, and when the second clock signal is at a low level, the first clock signal is at a high level.

10. A driving method, applied in a driving circuit, the driving circuit comprising at least one shift register, and each of the shift register comprising:

a first input unit configured to provide a signal at a first fixed potential terminal to a first node under control of an input signal terminal, provide a signal at the input signal terminal to the first node under control of a second node and a first clock signal terminal, and provide the signal at the input signal terminal to the first node under control of the second node and a second clock signal terminal;

a second input unit configured to provide the signal at the input signal terminal to the second node under control of the first node, and provide the signal at the first fixed potential terminal to the second node under control of the second clock signal terminal; and an output unit configured to provide a signal at the first clock signal terminal to an output signal terminal under control of a signal at the first node, and provide a signal at a second fixed potential terminal to the output signal terminal under control of a signal at the second node, wherein the driving method comprises:

in a first phase, providing a first level signal to the input signal terminal, a second level signal to the first clock signal terminal and the first level signal to the second clock signal terminal, such that the first level signal is outputted at the output signal terminal;

in a second phase, providing the second level signal to the input signal terminal, the first level signal to the first clock signal terminal and the second level signal to the second clock signal terminal, such that the first level signal is outputted at the output signal terminal;

in a third phase, providing the first level signal to the input signal terminal, the second level signal to the first clock signal terminal and the first level signal to the second clock signal terminal, such that the second level signal is outputted at the output signal terminal; and in a fourth phase, providing the first level signal to the input signal terminal, the first level signal to the first clock signal terminal and the second level signal to the second clock signal terminal, such that the first level signal is outputted at the output signal terminal.

11. The driving method according to claim 10, wherein the signal at the first fixed potential signal is different from the signal at the second fixed potential signal, and the signal at the first clock signal terminal and the signal at the second clock signal terminal are both pulse signals, and when the signal at the first clock signal terminal is at a low level, the signal at the second clock signal terminal is at a high level, and when the signal at the second clock signal terminal is at a low level, the signal at the first clock signal terminal is at a high level.

12. The driving method according to claim 10, wherein the first input unit comprises a first transistor, a second transistor, a third transistor, and a fourth transistor, the first transistor has a control terminal connected to the input signal terminal, a first terminal connected to the first fixed potential terminal, and a second terminal connected to the first node, the second transistor has a control terminal connected to the first clock signal terminal, a first terminal connected to the first node and a second terminal connected to a first terminal of the fourth transistor, the third transistor has a control terminal connected to the second clock signal terminal, a first terminal connected to the first node and a second terminal connected to the first terminal of the fourth transistor, and the fourth transistor has a control terminal connected to the second node, the first terminal connected to the second terminals of the second transistor and the third transistor, and a second terminal connected to the input signal terminal.

13. The driving method according to claim 10, wherein the second input unit comprises a fifth transistor and a sixth transistor, the fifth transistor has a control terminal connected to the second clock signal terminal, a first terminal connected to the first fixed potential terminal, and a second terminal connected to the second node, and the sixth transistor has a control terminal connected to the first node, a first terminal connected to the input signal terminal, and a second terminal connected to the second node.

14. The driving method according to claim 13, wherein the second input unit further comprises a seventh transistor, and the seventh transistor has a control terminal connected to the first fixed potential terminal, a first terminal connected to the first node, and a second terminal connected to the control terminal of the six transistor.

15. The driving method according to claim 10, wherein the output unit comprises an eighth transistor and a ninth transistor,
- the eighth transistor has a control terminal connected to the second node, a first terminal connected to the second fixed potential terminal, and a second terminal connected to the output signal terminal, and
- the ninth transistor has a control terminal connected to the first node, a first terminal connected to the first clock signal terminal, and a second terminal connected to the output signal terminal.

16. The driving method according to claim 10, further comprising a first capacitor and a second capacitor,
- the first capacitor has a first terminal connected to the first node, and a second terminal connected to the output signal terminal, and
- the second capacitor has a first terminal connected to the second node, and a second terminal connected to the second fixed potential terminal.

17. The driving method according to claim 10, wherein the at least one shift register comprises a plurality of cascaded shift registers,
- wherein the input signal terminal of the shift register at a first stage of the plurality of cascaded shift registers is connected to a start signal terminal,
- the input signal terminal of the shift register at each stage other than the first stage of the plurality of cascaded shift registers is connected to the output signal terminal of the shift register at its previous stage,
- the first clock signal terminal of the shift register at each odd numbered stage of the plurality of cascaded shift registers is configured to receive the first clock signal, and the second clock signal terminal of the shift register at each odd numbered stage of the plurality of cascaded shift registers is configured to receive the second clock signal,
- the first clock signal terminal of the shift register at each even numbered stage of the plurality of cascaded shift registers is configured to receive the second clock signal, and the second clock signal terminal of the shift register at each even numbered stage of the plurality of cascaded shift registers is configured to receive the first clock signal,
- when the first clock signal is at a low level, the second clock signal is at a high level, and
- when the second clock signal is at a low level, the first clock signal is at a high level.

* * * * *